June 5, 1951 H. M. BACH 2,555,391

RADIO OSCILLATOR CONTROL

Filed March 4, 1946 2 Sheets-Sheet 1

Inventor
HENRY M. BACH

By Herman L. Gordon
Attorney

June 5, 1951 H. M. BACH 2,555,391

RADIO OSCILLATOR CONTROL

Filed March 4, 1946

2 Sheets-Sheet 2

Inventor
HENRY M. BACH

By Herman L. Gordon

Attorney

Patented June 5, 1951 2,555,391

UNITED STATES PATENT OFFICE 2,555,391

RADIO OSCILLATOR CONTROL

Henry M. Bach, Woodmere, N. Y., assignor, by mesne assignments, to Arthur A. Glass, New York, N. Y.

Application March 4, 1946, Serial No. 651,886

5 Claims. (Cl. 250—20)

This invention relates to modulated-carrier signal-receiving systems, and more particularly to the tuning and control of the frequency generated by the local oscillation circuit of a superheterodyne receiver.

A main object of the invention is to provide a novel and improved tuning system for a superheterodyne receiver.

A further object of the invention is to provide an improved superheterodyne receiving system wherein the intermediate frequency is maintained at a predetermined value for all tuning adjustments of the receiver.

A still further object of the invention is to provide an improved superheterodyne receiving system employing step-tuning wherein the resonant frequency of the receiver is automatically controlled to provide accurate tuning steps regardless of the strength of the incoming signal carrier and wherein extremely simple and precise means for stabilizing the step frequencies is provided.

A still further object of the invention is to provide an improved method and means for operating a superheterodyne receiver wherein the local oscillator circuit is tuned to provide accurately spaced frequency steps, said steps being maintained stable in frequency by automatic frequency control means employed in conjunction with the local oscillator and referenced against a stable standard source frequency.

A still further object of the invention is to provide a novel and improved oscillator capable of producing any one of a predetermined range of step frequencies, the respective step frequencies being referenced against a very stable local frequency standard.

A still further object of the invention is to provide an improved oscillator structure adapted to be employed, for example, as the local oscillator of a superheterodyne receiver, said oscillator structure being capable of providing a predetermined range of crystal-controlled injection frequencies for step-tuning the receiver and wherein only one crystal is employed to furnish the necessary frequency stability for all of the step frequencies.

A still further object of the invention is to provide an improved tuning means for radio receivers, said tuning means providing correct tuning of the receiver even when the manual control elements of the tuning means are set only in roughly approximate correct positions for the desired channels, whereby an inexpert operator may easily obtain correct tuning of the receiver.

A still further object of the invention is to provide improved tuning means for radio receivers, said tuning means incorporating automatic frequency control of the local oscillator frequency of a superheterodyne receiver and wherein the operation of the automatic frequency control is independent of the strength of the incoming signal, thus avoiding the dragging of a strong signal over a large portion of the tuning dial before the weak signal is tuned in and also thereby avoiding the possibility of missing intervening signal channels as occurs frequently in conventional AFC systems.

Other objects and advantages of the invention will become apparent from the following description and claims, and from the accompanying drawings, wherein:

Figure 1:
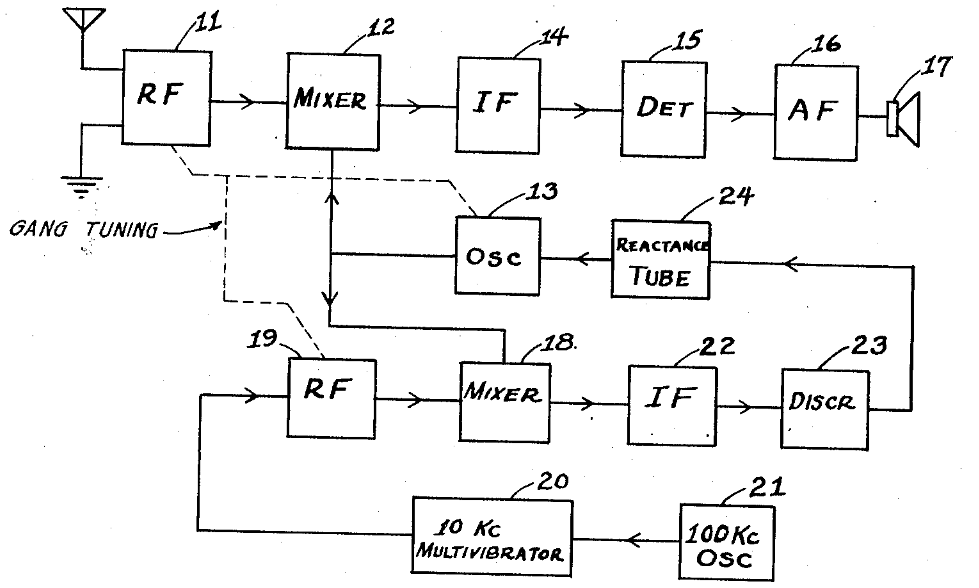
Figure 1 is a simplified block diagram illustrating a preferred arrangement of components of a superheterodyne receiver constructed in accordance with and employing the method and means of the present invention.

In the conventional superheterodyne radio receiver the local oscillator is required to produce a frequency which, when mixed with the input signal-modulated carrier frequency, produces the intermediate frequency. Ordinarily the local oscillator is continuously tuned, as by a variable condenser, over its frequency range, said variable condenser being usually ganged with one or more additional tuning condensers for tuning other parts of the receiver.

The oscillator condenser must be very carefully adjusted to "track" with the other tuning condensers in order to produce a substantially constant intermediate frequency for all signals over the tuning band. Perfect tracking is practically impossible to obtain, so that ordinarily compromise adjustments are made whereby the condensers are tracked at three points over the band.

Even if the oscillator condenser is initially adjusted for satisfactory tracking, it may be subsequently affected by conditions of temperature, vibration and the like, so as to become misaligned and to thereby reduce the overall sensitivity of the receiver, either at certain points in the tuning band or entirely over said band. This condition may be aggravated by further mechanical misalignment where push buttons or other mechanical devices are employed to establish the correct setting of the ganged tuning condensers, or merely by the thermal warping or axial shifting of the plates of the oscillator condenser.

It is a common fact, therefore, that after a period of use, a superheterodyne receiver, manually tuned either by directly rotating ganged condenser shafts or by actuating push buttons to thereby rotate said shafts, will lose sensitivity and selectivity, and in a majority of cases the deterioration in performance can be traced to the misalignment of the oscillator condenser.

It is also a common fact that the accuracy of calibration of a receiver tuning dial deteriorates seriously after a period of use of the receiver, largely due to mechanical shifting of the dial elements with respect to their associated electrical elements, and therefore accurate visual tuning of the receiver in accordance with calibration markings on the dial becomes impossible.

It is a prime purpose of this invention to provide a system of tuning for a superheterodyne receiver wherein the oscillator condenser is merely a rough-tuning or channel-selecting agency and is not fundamental in producing the exact value of frequency for the local oscillator required to obtain the correct value of intermediate frequency when combined with the desired input carrier. Furthermore, in the system of the present invention, misalignment of the oscillator condenser from its initial condition of adjustment will produce no serious deterioration in performance, and the original tracking thereof need not be made with as great a degree of precision as required in ordinary receivers.

An additional feature of the present invention resides in the provision of automatic frequency control of the local oscillator frequency reference against a local very stable crystal-controlled base frequency, whereby the frequency injected by the local oscillator into the converter stage is maintained exactly correct for the desired input carrier, regardless of the strength of said input carrier. As will be pointed out subsequently, this feature has several advantages over the conventional systems of automatic frequency control now in use wherein the correcting action depends in some degree upon the strength of the input carrier.

In the broadcast band extending from approximately 500 kc. to approximately 1600 kc., all transmitting stations operate on multiples of 10 kc., such as 630 kc., 710 kc., 1500 kc., etc. In tuning a receiver over this band it is therefore only necessary to tune to multiples of 10 kc. to receive any station in the band. In the range extending, for example, from 500 to 1590 kc. there are 110 channels respectively, separated by 10 kc. Therefore in order to tune the receiver to any station in this particular band it must be possible to set the local oscillator, or its equivalent, to obtain a suitable value of frequency which will be variable at least in 10 kc. steps and which will combine with any signal carrier to produce the intermediate frequency of the receiver.

It is also desirable to eliminate the possibilities of mistuning such as are inherent in the conventional condenser-tuned receiver employing either direct manual tuning or push-button mechanical tuning, such mistuning usually causing serious distortion. This problem has heretofore been dealt with by employing a type of crystal control for the local oscillator wherein a separate crystal is employed to produce each local oscillator frequency required to beat with the input carrier to produce the constant intermediate frequency carrier. As can be readily seen, however, 110 crystals would be required to operate the oscillator at all of the required frequencies for receiving all transmitting stations over the above-defined broadcast band, and appropriate switching means would have to be furnished for selectively connecting the crystals into the oscillator circuit. This would result in a very cumbersome arrangement.

In accordance with this invention only one crystal is required to tune the local oscillator so as to provide all the necessary frequencies to tune to all stations over a desired band, such as the broadcast band, where the station channels are separated by equal fixed intervals. This is accomplished in a manner now to be described.

Referring to Figure 1, the input signal modulated carrier is introduced into the receiver at a tuned radio frequency stage 11. The amplified carrier is delivered from input stage 11 to a mixer 12. Also delivered to mixer 12 is a locally generated frequency from a local oscillator 13 which heterodynes in mixer 12 with the input carrier and produces a resultant signal modulated intermediate frequency which is delivered from mixer 12 to an intermediate frequency amplifying stage 14. From amplifying stage 14 the amplified signal-modulated intermediate frequency is delivered to a detector 15 where the signal is demodulated and is delivered to an audio amplifier stage 16 which delivers the amplified audio signal to a sound reproducing device 17.

A portion of the locally generated frequency from oscillator 13 is delivered to an auxiliary mixer 18. Also delivered to mixer 18 through a tuned radio frequency stage 19 is a signal derived from a multivibrator 20 which is stabilized by a 100 kc. crystal controlled oscillator 21. The output wave of multivibrator 20 is very complex in shape and the multivibrator is arranged so that the tenth harmonic of its fundamental frequency locks with the 100 kc. output frequency of crystal oscillator 21. The output wave of multivibrator 20 therefore contains a multitude of harmonic frequencies, each frequency being a multiple of 10 kc. Radio frequency stage 19 selects a particular component of the multivibrator output wave. Said component is delivered to auxiliary mixer 18. The resultant beat frequency derived in mixer stage 18 is delivered to an auxiliary intermediate frequency amplifier 22 to which is connected a discriminator 23 which develops a correcting direct current voltage across its output terminals whose polarity and magnitude depend respectively upon the sense and degree of deviation of the output frequency of mixer 18 from the center resonant frequency of intermediate frequency amplifier 22. The correcting voltage from discriminator 23 is delivered to a reactance tube 24 cooperating with oscillator 13 so as to vary the oscillator frequency in accordance with the correcting voltage applied to the reactance tube by discriminator 23. The automatic frequency control elements 22, 23 and 24 are so arranged that the output frequency of oscillator 13 will be maintained exactly equal to the value required to beat with the incoming carrier to produce the main intermediate frequency of the receiver.

In a practical embodiment of the invention the tuning condensers of radio frequency stage 11, oscillator 13 and radio frequency stage 19 are ganged together and the tuned circuits thereof are arranged so that whenever radio frequency stage 11 is resonant to a predetermined input carrier frequency, oscillator 13 will be tuned to provide a local injection frequency suitable to beat with the input carrier to produce the intermediate frequency of the receiver, and radio frequency stage 19 will be resonant to a particular harmonic frequency of multivibrator 20. The band pass characteristics of intermediate frequency stage 22 are such that only one of the multivibrator output frequencies, namely, the one selected by radio frequency stage 19, will pass through to discriminator 23 at any point in the tuning range of said radio frequency stage.

As an example illustrating the operation of the above system, let us assume that radio frequency stage 11 is tuned approximately to a signal-modulated carrier of 630 kc. and that the intermediate frequency of the receiver is 455 kc. Let us further assume that in this position of the ganged tuning condensers, the oscillator 13 would normally generate a local injection frequency of 1088 kc. Let us still further assume that the auxiliary intermediate frequency value is 175 kc. Radio frequency stage 19 would then be tuned to the 1260 kc. component of the multivibrator output wave. The 1260 kc. frequency at the output terminals of radio frequency stage 19 heterodynes with the 1088 kc. frequency from oscillator 13 in mixer 18, resulting in a beat frequency of 172 kc. which is delivered to intermediate frequency amplifier 22. Since the center resonant frequency of amplifier 22 is 175 kc. and the center frequency of the discriminator is also 175 kc., a direct current voltage is developed at the output terminals of discriminator 23 which corresponds in polarity and magnitude to the voltage increment needed at the input terminals of reactance tube 24 to change the value of reactance thereof in such a manner as to decrease the frequency of local oscillator 13 from 1088 kc. to almost exactly 1085 kc. The 1085 kc. injection frequency furnished by oscillator 13 then heterodynes with the incoming 630 kc. carrier in mixer stage 12 to produce the require signal-modulated 455 kc. intermediate frequency carrier.

The bias on the reactance tube 24 is set so that the control action on oscillator 13 for each required injection frequency begins approximately 5 kc. below said injection frequency and ends approximately 5 kc. above said injection frequency, in terms of the amount of frequency correction applied by the reactance tube in combination with the other automatic frequency control elements. Therefore, as the oscillator 13 is tuned over its frequency spectrum, it hops in 10 kc. steps from one injection frequency to the next injection frequency, each of the injection frequencies being a correct value for heterodyning with one of the input carrier frequencies in the broadcast spectrum. Of course, if no input carrier is present no intermediate frequency carrier will be delivered from mixer 12 to intermediate frequency amplifier 14. But regardless of whether or not input carriers are present, the correcting action of the automatic frequency control elements to establish the proper injection frequency for oscillator 13 for any possible input carrier will be achieved, and the relative strength or weakness of the input carriers will have no effect on the efficiency of the correcting action.

The band pass characteristics of radio frequency stage 11 are such that the input carrier is attenuated relatively little over a range extending from approximately 5 kc. below to approximately 5 kc. above the condition of exact resonance of the input stage with the input carrier. This allows a particular carrier to be received with adequate strength over a range of tuning from approximately 5 kc. below to approximately 5 kc. above the correct frequency setting of the tuning dial for that particular carrier.

Figure 2:
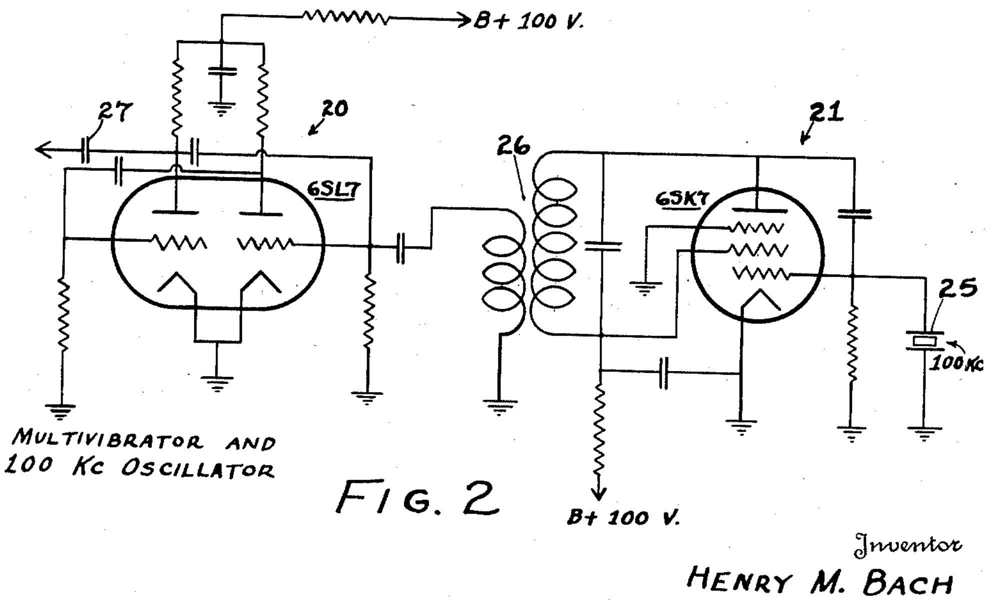
Figure 2 is a schematic wiring diagram of a multivibrator and base frequency crystal oscillator adapted to be employed in the receiver illustrated in the block diagram of Figure 1.

Figure 2 discloses a schematic circuit diagram of a multivibrator and 100 kc. crystal controlled oscillator adapted to be employed at 20 and 21 respectively in the system of Figure 1. The multivibrator is of the conventional type employing a dual triode tube such as the 6SL7 connected in the usual manner as a two-stage resistance coupled amplifier in which the output of the second stage supplies the input to the first stage and the output of the first stage supplies the input to the second stage. The frequency of the oscillations is determined primarily by the time constants of the grid-leak, grid condenser arrangements of the multivibrator. The fundamental frequency thereof is stabilized at 10 kc. by injecting into the multivibrator circuit a 100 kc. voltage from an oscillator whose frequency is accurately stabilized by a 100 kc. crystal 25. The 100 kc. oscillator is conventional in structure. The 100 kc. crystal oscillator is coupled to the multivibrator by a transformer 26, the secondary of the transformer being connected in the grid circuit of one of the triode elements of the 6SL7 tube. The plate of the other triode element of the 6SL7 tube is connected to the input grid of the radio frequency stage 19 through a direct current blocking condenser 27.

Figure 3:
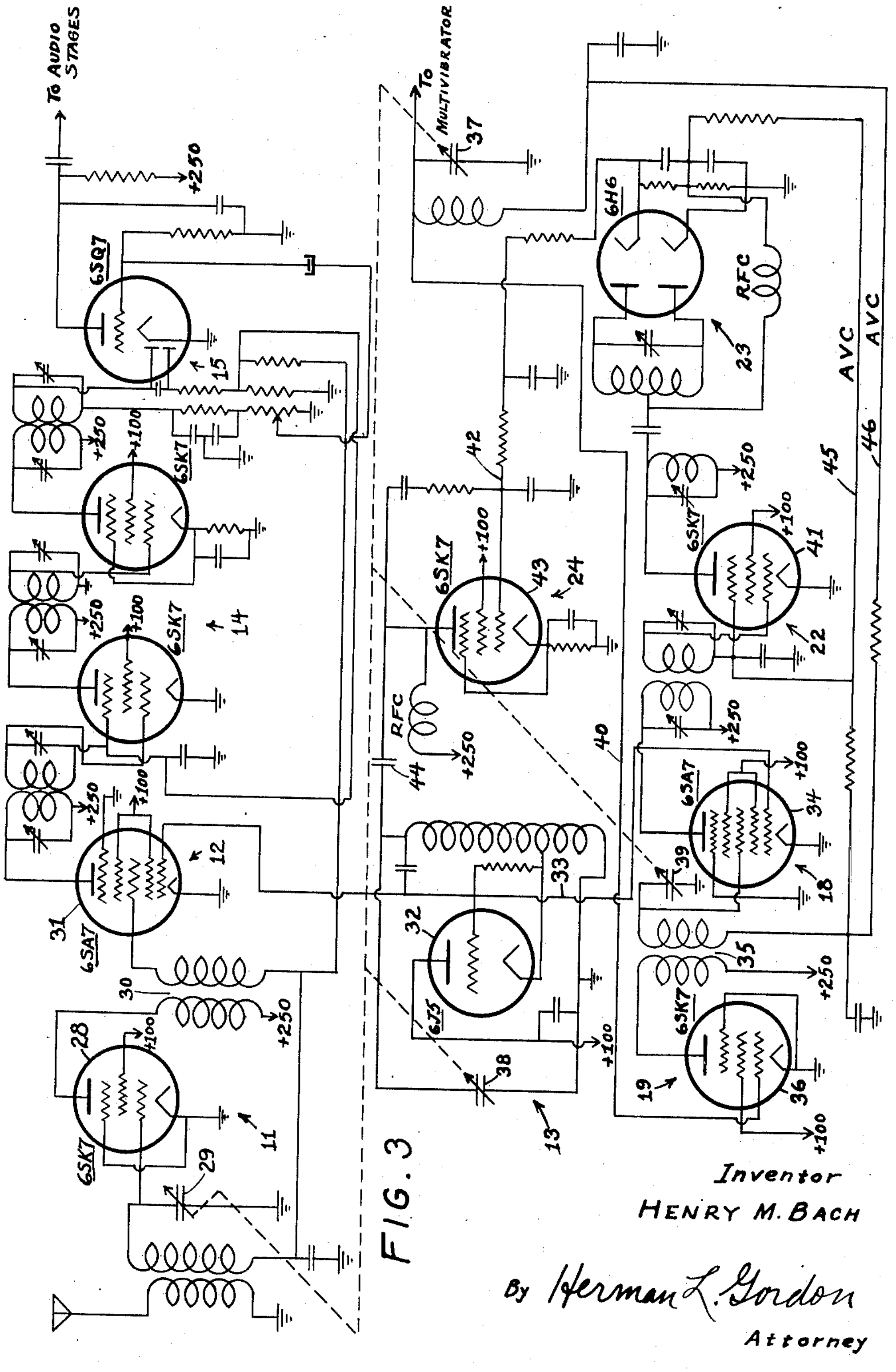
Figure 3 is a schematic detailed wiring diagram of a superheterodyne receiver embodying the arrangement of components and method of operation illustrated in the block diagram of Figure 1.

Referring to Figure 3, a schematic wiring diagram of a specific embodiment of a superheterodyne radio receiver employing the tuning method and means of this invention is disclosed. The radio frequency input stage employs a tube 28 of the 6SK7 type and includes a variable tuning condenser 29. The input stage is coupled by a transformer 30 to an input grid of a mixer tube 31 which is of the 6SA7 type. Coupled to another input grid of tube 31 is the local oscillator 13 which employs a tube 32 of the 6J5 type and is tuned by a variable condenser 38. The output terminal of oscillator 13 is also connected by a wire 33 to an input grid of a subsidiary mixer tube 34 of the 6SA7 type. Also coupled to an input grid of tube 34 by a transformer 35 is a subsidiary radio frequency stage 19 having an input tube 36 of the 6SK7 type. The control grid of tube 36 is connected by a wire 40 to the output terminal of the multivibrator, said control grid being tuned by a parallel tuned circuit which includes a variable condenser 37. The secondary of transformer 35 is tuned by a variable condenser 39. The plate of the subsidiary mixer tube 34 is connected to the input terminal of the subsidiary intermediate frequency stage 22 which employs a tube 41 of the 6SK7 type. The plate of tube 41 is coupled to the input terminal of a conventional discriminator stage 23 whose output terminal is connected at 42 to the control grid of a reactance tube 43 of the 6SK7 type. The plate of reactance tube 43 is connected through a direct current blocking condenser 44 to the tank circuit of oscillator 13.

Discriminator 23 is arranged to provide at terminal 42 a direct current potential whose polarity and magnitude are respectively determined by the sense and degree of deviation of the resultant frequency derived in mixer tube 34 from the center resonant frequency of intermediate frequency stage 22. The discriminator circuit is of the conventional coupled-circuit type and is employed to provide AVC voltage for the mixer tube 34 and the intermediate frequency stage tube 41 by a connection 45. AVC voltage is also furnished by a connection 46 to the control grid circuit of the radio frequency stage tube 36.

Reactance tube 43 is biased so that its apparent reactance will be varied by the direct current potential produced by the discriminator in response to frequency deviations of the resultant output frequency of mixer tube 34 from 5 kc. below the center resonant frequency of the auxiliary intermediate frequency stage 22 to 5 kc. above said center resonant frequency. This occurs in a manner to produce a correcting change in frequency of oscillator 13 to restore the oscillator frequency to a stable value which will beat with the incoming signal to produce the intermediate frequency of the receiver. Condensers 29, 38, 39 and 37 are ganged together so that input circuit 11, local oscillator 13, subsidiary radio frequency circuit 19 and the input circuit of auxiliary mixer 18 are simultaneously tuned. However, because of the control action provided by discriminator 23 and the reactance tube circuit 24, the local oscillator frequency varies discontinuously in 10 kc. steps over the tuning range thereof. This is accomplished in the following manner: as the local oscillator is tuned, a portion of its output enters mixer 18 at one of the grids of tube 34. At the same time, since condenser 39 of radio frequency stage 19 is ganged with oscillator condenser 38, stage 19 selects a signal from the output of multivibrator 20 and feeds it to mixer 18 at another grid of tube 34. This signal beats with the oscillator signal in mixer tube 34, providing a resultant beat frequency whose value depends upon the degree of deviation of the oscillator frequency from the selected multivibrator signal. This beat frequency is fed into intermediate frequency stage 22 at the control grid of tube 41. The beat frequency may be either above or below the center resonant frequency of stage 22, depending upon whether the frequency of local oscillator 13 is above or below the correct value thereof required to tune the receiver to the incoming channel. The beat frequency thus derived is fed into the discriminator stage 23 from the plate of tube 41. Discriminator stage 23 is of a conventional type (see U. S. Patent 2,123,642 to D. E. Foster) and is arranged so that when the input signal thereto is equal to the center resonant frequency of intermediate frequency stage 22, the output D. C. voltage at the terminal 42 of the discriminator is zero; when the input signal is below said center resonant frequency the D. C. voltage at terminal 42 is negative; when the input signal is above said center resonant frequency the D. C. voltage at terminal 42 is positive. The value of the voltage at terminal 42 therefore depends on the degree and direction of deviation of the input beat frequency from the center resonant frequency of the intermediate frequency stage 22.

Since radio frequency stage 19 is tuned simultaneously with oscillator 13, due to the ganging of condensers 38 and 39, the different step frequencies furnished by the multivibrator 20 will be successively selected and mixed with the frequency of oscillator 13 as tuning proceeds over the range of oscillation of said oscillator. Each time a multivibrator frequency is mixed with an oscillator frequency in mixer stage 18, a beat frequency will be derived which is in the neighborhood of the center resonant frequency of the intermediate frequency stage 22 because there is actually rough tracking relationship between the tuning of oscillator 13 and the tuning of the radio frequency selector stage 19. The derived beat frequency, however, will always be a measure of the amount of frequency deviation which exists between the actual frequency of oscillator 13 and the required value thereof for injection into mixer 12, inasmuch as multivibrator 20 furnishes a base reference frequency for every channel frequency with which oscillator 13 must beat in mixer 12.

The beat frequency derived at mixer 18 is converted, as above explained, by discriminator 23 into a D. C. voltage which may have either positive or negative values and which has a zero value when said beat frequency is equal to the center resonant frequency of stage 22. This D. C. voltage is applied to the grid of a reactance tube 43. The reactance tube 43 is connected in a conventional manner (see U. S. Patent 2,129,123 to D. E. Foster or U. S. Patent 2,173,907 to L. R. Kirkwood) across the tank circuit of oscillator 13. Said reactance tube consists of a pentode whose plate-cathode circuit is connected across the tank circuit of the oscillator through the condenser 44. The control grid of tube 43 is supplied with an exciting voltage derived from the alternating voltage existing at the plate of tube 43 but 90° out of phase with it. The alternating grid voltage acting in the plate circuit of tube 43 therefore draws an alternating plate current which is 90° lagging with respect to the voltage at the plate of the tube. Tube 43 therefore acts as an inductance having a magnitude depending upon the amplification of said tube, and hence upon the bias developed at 42 by the discriminator 23.

Since the plate current of tube 43 lags 90° behind the R. F. plate voltage thereof, it provides the same effects as though an inductance were connected across the tank circuit of oscillator 13. Therefore, when the discriminator potential at 42 increases, the alternating plate current of tube 43 likewise increases, giving the effect of reduced inductance across the oscillator tank circuit. This causes the oscillator frequency to increase. In the same manner, when the discriminator potential at 42 decreases, the effect is the same as increasing the effective inductance across the tank circuit, thereby causing the oscillator frequency to decrease.

When the oscillator frequency is too high for a particular input channel frequency, the beat frequency produced in mixer 18 falls below the center resonant frequency of stage 22. A negative D. C. potential then appears at 42, reducing the simulated inductive shunt effect of reactance tube 43 on the oscillator tank circuit. The oscillator frequency is therefore automatically reduced until the biasing potential at 42 becomes substantially zero. The same effect occurs in an opposite sense when the oscillator frequency is too low for a particular input channel frequency. The potential produced at discriminator terminal 42 therefore acts to correct the frequency of oscillator 13. This action occurs for each step frequency of multivibrator 20. The frequency of oscillator 13 is thus maintained, for each step frequency of multivibrator 20, at a proper value to beat with the nearest input carrier to which radio frequency stage 11 is tuned, to provide as a resultant the signal-modulated intermediate frequency carrier to which intermediate frequency stage 14 is tuned. As a result, each incoming carrier is accurately tuned regardless of the precision or lack of precision with which the tuning dial may be manipulated, and the tuning in of a desired carrier, where there are carriers on adjacent channels, is thereby greatly facilitated. Furthermore, the overall performance of the receiver will not be adversely affected by slight tracking discrepancies of the ganged tuning condensers.

While a specific embodiment of a method and means of tuning a superheterodyne receiver and a specific embodiment of a step tuned local oscillator adapted to be employed in such a receiver have been disclosed in the foregoing description, it will be understood that various modifications within the spirit of the invention may occur to those skilled in the art.

What is claimed is:

1. In a superheterodyne radio receiver, a mixer stage, a radio frequency stage connected to the input of said mixer stage, a local oscillator connected to the input of said mixer stage, an intermediate frequency stage connected to the output of said mixer stage, means for tuning said local oscillator over a range of frequencies, a multivibrator, means mechanically linked with said tuning means for selecting a predetermined harmonic wave from the output wave of the multivibrator and combining it with the output wave of said local oscillator to thereby produce a resultant wave, and means responsive to the frequency of said resultant wave for holding the frequency of said local oscillator substantially constant over a predetermined range of adjustment of said tuning means.

2. In a superheterodyne radio receiver, a mixer stage, a radio frequency stage connected to the input of said mixer stage, a first variable tuning element connected to said radio frequency stage, a local oscillator connected to the input of said mixer stage, an intermediate frequency stage connected to the output of said mixer stage, means for tuning said local oscillator over a range of frequencies, a 10 kc. multivibrator, means mechanically linked with said first variable tuning element and said tuning means for selecting a predetermined harmonic wave from the output wave of the multivibrator and combining it with the output wave of said local oscillator to thereby produce a resultant wave, and means responsive to the frequency of said resultant wave for holding the frequency of said local oscillator substantially constant over a predetermined range of adjustment of said tuning means.

3. The structure of claim 2, and wherein said predetermined range of adjustment corresponds approximately to a 10 kc. change in frequency of said local oscillator.

4. In a superheterodyne radio receiver, a first mixer stage, a radio frequency stage connected to the input of said first mixer stage, a local oscillator connected to the input of said first mixer stage, means for tuning said local oscillator over a range of frequencies, a multivibrator, a second mixer stage, means for selecting a predetermined harmonic wave from the output wave of said multivibrator and combining it with the output wave of said local oscillator in said second mixer stage to thereby produce a resultant wave, and means responsive to the frequency of said resultant wave for holding the frequency of said local oscillator substantially constant over a predetermined range of adjustment of said tuning means.

5. The structure of claim 4, and wherein an intermediate frequency stage is provided, connected to the output of the first mixer stage, and wherein said predetermined range of adjustment corresponds to a range extending approximately 5 kc. on either side of that local oscillator frequency, which, when combined with the center resonant frequency of the carrier input stage produces the intermediate frequency of the receiver.

HENRY M. BACH.

REFERENCES CITED

The following references are of record in the file of this patent:

UNITED STATES PATENTS

| Number | Name | Date |
|---|---|---|
| 2,112,826 | Cook | Apr. 5, 1938 |
| 2,114,036 | Smith et al. | Apr. 12, 1938 |
| 2,228,815 | Deerhake | Jan. 14, 1941 |
| 2,270,023 | Ramsey | Jan. 13, 1942 |
| 2,282,834 | Thomas | May 12, 1942 |
| 2,400,648 | Korman | May 21, 1946 |
| 2,410,817 | Ginzton | Nov. 12, 1946 |
| 2,450,019 | Ranger | Sept. 28, 1948 |